United States Patent [19]
Oike

[11] Patent Number: 6,107,665
[45] Date of Patent: Aug. 22, 2000

[54] SEMICONDUCTOR DEVICE HAVING A FIXED STATE BY INJECTED IMPURITY

[75] Inventor: Junichiro Oike, Tokyo, Japan

[73] Assignee: Oki Electric Industry Co., Ltd., Tokyo, Japan

[21] Appl. No.: 09/029,884

[22] PCT Filed: Jul. 10, 1998

[86] PCT No.: PCT/JP97/02393

§ 371 Date: Mar. 2, 1998

§ 102(e) Date: Mar. 2, 1998

[87] PCT Pub. No.: WO98/03995

PCT Pub. Date: Jan. 29, 1998

[30] Foreign Application Priority Data

Jul. 24, 1996 [JP] Japan .................................. 8-195044

[51] Int. Cl.[7] .................................................. H01L 29/12
[52] U.S. Cl. .......................... 257/391; 257/346; 257/387; 257/368; 257/401; 257/340; 257/343; 257/336; 257/344; 257/409; 257/408
[58] Field of Search ..................... 257/346, 387, 257/368, 401, 340, 343, 336, 344, 409, 408, 391

[56] References Cited

U.S. PATENT DOCUMENTS 5,969,407 10/1999 Gardner et al. .................... 257/617

FOREIGN PATENT DOCUMENTS 55-67782 5/1980 Japan .

*Primary Examiner*—Fetsum Abraham
*Attorney, Agent, or Firm*—Jones Volentine, L.L.P.

[57] ABSTRACT

The present invention includes two transistors every output signal line connected at crosspoints of a plurality of input signal lines and a plurality of output signal lines, with a channel region of one of these transistors being implanted or diffused with an impurity so as to be normally in an active state. By then selectively making electrical connection with one of the plurality of output signal lines, the coded data cannot be easily known because the corresponding relationship of the input signal lines and the output signal lines cannot be confirmed from the wiring layout.

20 Claims, 7 Drawing Sheets

SEMICONDUCTOR DEVICE HAVING A FIXED STATE BY INJECTED IMPURITY

TECHNICAL FIELD

The present invention relates to a semiconductor device and more particularly relates to an IC for handling data necessary in the security of code data.

BACKGROUND ART

In recent years, use of cash cards and IC cards etc. has become widespread. When these cards are used, information is written to a card using a card reader/writer or written information is read. Inputting of a secret number is therefore first carried out during card accesses. The secret number usually comprises a plurality of digits registered by the user beforehand. When the card user accesses the card at a card reader/writer the correct secret number can be inputted. However, if someone who is not the card user wishes to illegally access the card, the card cannot be accessed if the correct secret number is not inputted.
There are, however, cases where information written to the card can be illegally read and if the secret number is left written on the card as is, accesses with the card can be made at a card reader/writer based on the read secret number. Therefore, rather than just writing the secret number on the card as is, there are many cases where the secret number is written to the card as coded data, with a semiconductor device being used for this coding.

A coding process for a semiconductor device capable of carrying out this coding is performed using the kind of configuration shown, for example, in FIG. 6.

In FIG. 6, "ABCD" is inputted to a data converter 1 via data lines 11, 13, 15 and 17 as the data to be converted. The data is then converted using a first method of conversion at the data converter 1. The converted data is then inputted to a data converter 3 via data lines 21, 23, 25 and 27. The data converter 3 converts data in accordance with a second conversion method. This converted data is then outputted as coded data at data lines 31, 33, 35 and 37 as output data "A'B'C'D'". Security can then be improved by pre-writing this coded data to the card, etc. However, when coding is carried out by the configuration of FIG. 6, for example, the first bit "A" of each of the bits of the data "ABCD" to be converted is converted to "A'" via data lines 11, 21 and 31 positioned at the top and the third bit "C" is converted to "C'" via data lines 13, 23 and 33 positioned third from the top, i.e. converted data can be transferred at data lines arranged in the order of inputted bits of data. Unfortunately, deciphering of the secret number from the coded data can be easily achieved if the conversion contents of the data converters 1 and 3 can be known or analyzed.

If the data lines are not put in order so that, for example, after data bit "A" is converted at data converter 1, wiring is such that data line 21 becomes the third input from the top of the data converter 3, and that after data bit "C" is converted at the data converter circuit 1, the data line 23 becomes the uppermost input of the data converter 3, but as this follows the wiring pattern, this can be easily confirmed by eye.

Further, when the data lines become complicated or numerous, manufacturing processes increase and substantial delays occur due to resistance due to the increase in the number of lines and resistance due to the wiring material used and generation of coded data therefore takes substantial time.

In order to resolve the aforementioned problems, it is an object of the present invention to provide a semiconductor device capable of making deciphering of coded data more difficult and capable of improving security.

The present invention also sets out to provide a semiconductor device capable of easily achieving the above object without the necessity of complicated manufacturing processes.

The present invention further sets out to provide a semiconductor device capable of achieving the above object without increasing the time taken to generate coded data.

DISCLOSURE OF INVENTION

To achieve these objects, in the present invention, a semiconductor device comprises a first transistor, having first and second electrodes and a gate electrode, with a first signal being received at the first electrode, a second transistor, having first and second electrodes and a gate electrode, with a second signal being received at the first electrode and an output signal line connected to the second electrode of the first transistor and the second electrode of the second transistor. A voltage for putting the first and second transistors into a non-conducting state is supplied to the gate electrodes of the first and second transistors and a channel region of the first transistor or the second transistor is selectively injected with an impurity.

Further, to achieve these objects in the present invention, as disclosed in claim 2, the first electrode of the first transistor extends in a first direction and comprises a first data transfer line for transferring one bit of data comprising a plurality of bits, the first electrode of the second transistor extends in the first direction and comprises a second data transfer line for transferring a further bit of data comprising a plurality of bits, and the output signal lines extend in a direction orthogonal to the first and second data transfer lines.

Moreover, to achieve these objects in the present invention, as disclosed in claim 3, the gate electrode of the first transistor comprises a first potential supply line extending in parallel with the first data transfer line and the gate electrode of the second transistor comprises a second potential supply line extending in parallel with the second data transfer line.

Further, to achieve these objects in the present invention, as disclosed in claim 4, the first and second potential supply lines comprise polysilicon, and the first and second data transfer lines comprise polysilicon and are formed in the same layer as the first and second potential supply lines.

Still further, to achieve these objects in the present invention, as disclosed in claim 5, the second signal is inputted as a signal of a level inverted with respect to the first signal.

Even further, to achieve these objects in the present invention, as disclosed in claim 6, the first signal is fixed at a first potential level, the second signal is fixed at a second potential level different from the first potential level, and the output signal line is an input of a logic circuit.

Moreover, to achieve these objects in the present invention, as disclosed in claim 7, the logic circuit is an exclusive OR circuit.

To achieve these objects in the present invention, as disclosed in claim 8, a semiconductor device comprises a plurality of first data transfer lines, extending in a first direction, for transferring each bit of data comprising a plurality of bits, a plurality of second data transfer lines, extending in a second direction orthogonal to the first direction, for receiving and transferring data transferred by the plurality of first data transfer lines, and a plurality of first transistors with first electrodes connected to one of the plurality of first data transfer lines, second electrodes connected to every the second data transfer line, and with a prescribed potential being supplied to gate electrodes to bring about non-operating conditions. Here, channel regions of the first transistors or the second transistors connected so as to correspond to the plurality of second data transfer lines are selectively injected with an impurity.

Further, to achieve these objects in the present invention, as disclosed in claim 9, the gate electrodes of the first and second transistors comprise polysilicon, and the first and second data transfer lines comprise polysilicon and are formed at the same layer as the gate electrodes.

BEST MODE FOR CARRYING OUT THE INVENTION

Figure 1:
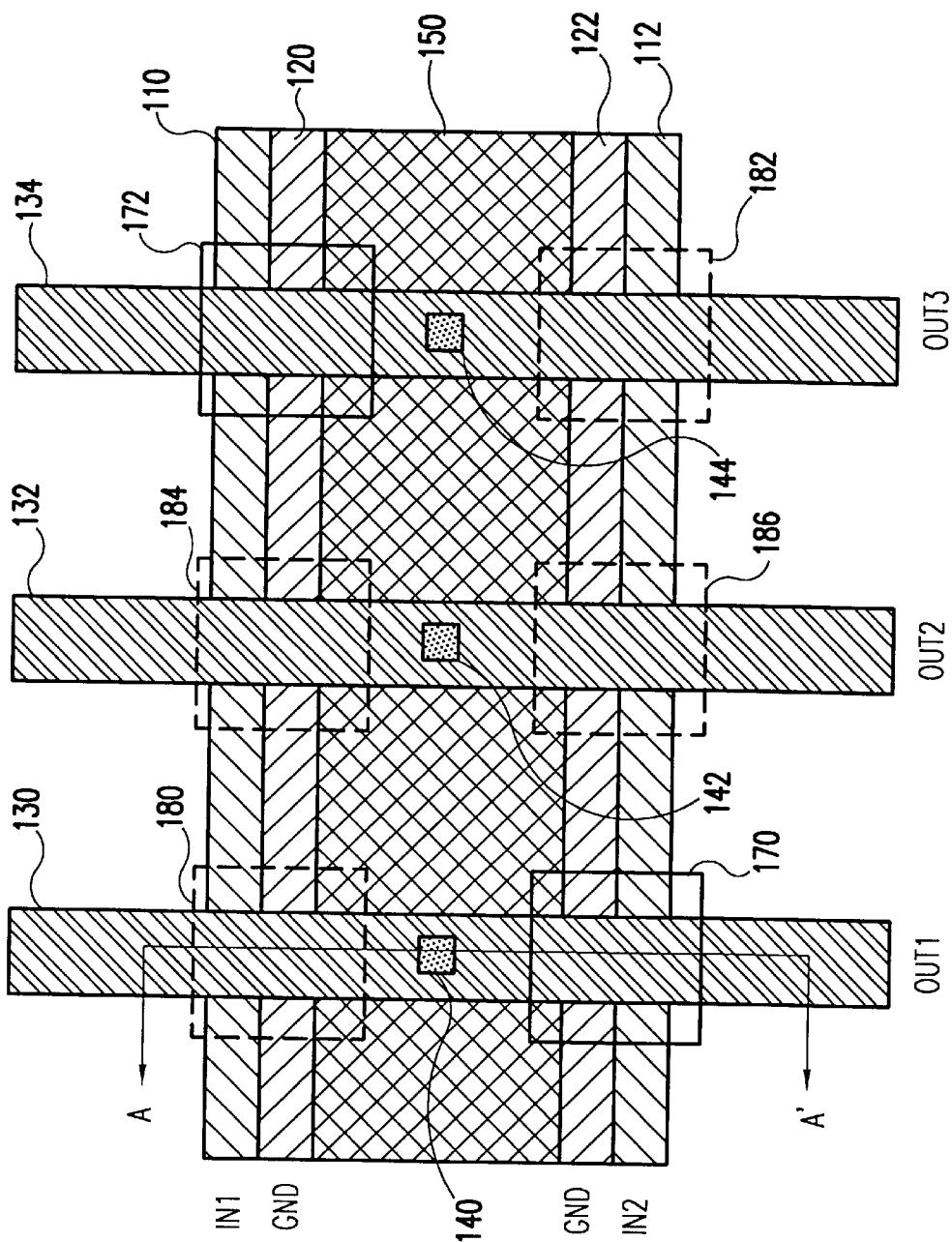
FIG. 1 is a view of the wiring layout of a semiconductor device of a first embodiment of the present invention.

The following is a detailed description, with reference to the drawings, of embodiments of the present invention.
FIG. 1 is a wiring layout diagram for a semiconductor device illustrating a first embodiment of the present invention. Wiring layout portions shown in FIG. 1 can be used as data wiring portions across data converter 1 and data converter 3 of FIG. 6. In FIG. 1, a configuration for two bits of data is shown as being typical.

In FIG. 1, input signal lines 110 and 112 are each for transferring one bit of data. The input signal lines 110 and 112 extend in parallel with each other in a first direction (the horizontal direction in FIG. 1). Potential supply lines 120 and 122 for transferring signals of a prescribed potential are arranged between the input signal lines 110 and 112. In this embodiment, a signal that is at earth potential is transferred by the potential supply lines 120 and 122 as the prescribed potential. Output signal lines 130, 132 and 134 are then arranged on top of this wiring. These output signal lines extend in parallel with each other in a second direction (the vertical direction in FIG. 1) orthogonal to the first direction. Connect portions 140, 142 and 144, and transistor configuration portions 170, 172, 180, 182, 184 and 186 are also shown but these portions will be described in detail later.

Figure 2:
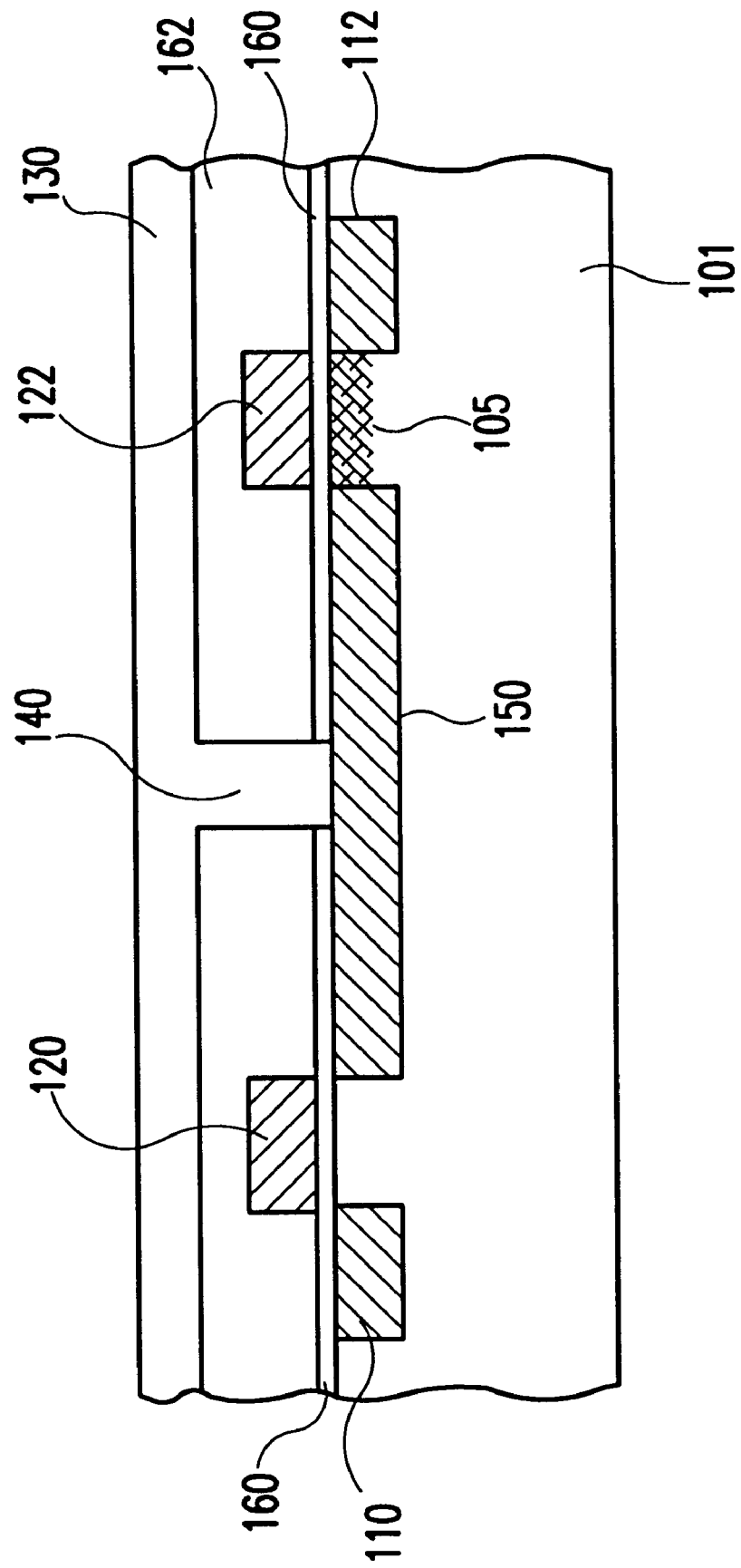
FIG. 2 is a view of a cross-section taken along A-A' of FIG. 1.

Next, a cross-section taken along A-A' of FIG. 1 is shown in FIG. 2 in order to illustrate the relationship of the connections of the above wiring. FIG. 2 only shows the relationship between the input signal lines 110 and 112, the potential supply lines 120 and 122, and the output signal line 130. However, this cross-section is also the same for other output signal lines 132 and 134 and a description is therefore only given for parts that differ, not for parts of the same cross-section. Elements of the structure in FIG. 2 that are the same as for FIG. 1 are given the same numerals.

In FIG. 2, input signal lines 110 and 112 are comprised of an n+ diffusion layer formed within a p-type substrate 101. A diffusion layer 150 comprising an n+ diffusion layer is formed between the input signal lines 110 and 112, with a gate oxidation film 160 being formed on the substrate 101. The potential supply line 120 is arranged on the gate oxidation film 160 between the input signal line 110 and the diffusion layer 150. Namely, a first transistor is constructed taking the potential supply line 120 as a gate electrode and the input signal line 110 and the diffusion layer 150 as two electrodes. This first transistor is formed at the square part 180 shown by the dotted lines of FIG. 1. The potential supply line 122 is arranged on the gate oxidation film 160 between the input signal line 112 and the diffusion layer 150, i.e. a second transistor is constructed taking the potential supply line 122 as a gate electrode and the input signal line 110 and the diffusion layer 150 as two electrodes. This second transistor is formed at a square part 170 shown by a solid line in FIG. 1. The potential supply lines 120 and 122 are wiring comprising polysilicon. An output signal line 130 extends along the potential supply lines 120 and 122 via an insulating layer 162. This output signal line 130 is electrically connected to the diffusion layer 150 via a connector portion 140. The output signal line 130 is of the same layer as other output signal lines 132 and 134 not shown in the drawings, with these output signal lines being wiring comprising metal.

An impurity region 105 is formed by ion implantation or diffusion of an n-type impurity at the region between the input signal line 112 and the diffusion layer 150, i.e. the channel region of the second transistor. The aforementioned second transistor is therefore a depression type and the first transistor which does not have an n-type impurity ion injected or diffused at the channel region is an enhancement type transistor. Portions of FIG. 1 where n-type impurities are not ion-injected or diffused into the channel region so that enhancement type transistors are formed, as with the first transistor, are shown by the dotted line square portions. Portions where n-type impurities are ion-injected or diffused into the channel region so that depression type transistors are formed, as with the second transistor, are shown by the solid line square portions.

As earth potentials are supplied to the gate electrodes of the first and second transistors in the above configuration, the first transistor is in a non-active state and the second transistor is in an active state. Bit data IN1 transferred by the input signal line 110 is not transferred to the output signal line 130 but bit data IN2 transferred by the input signal line 112 is transferred to the output signal line 130 via the second transistor.

Next, a description is given of the other output signal lines 132 and 134 using FIG. 1. With regards to the output signal line 132, n-type impurities are not ion injected or diffused at the channel regions of the first and second transistors shown by the dotted line square parts 184 and 186, i.e. the first and second transistors formed at the square parts 184 and 186 are both enhancement type transistors. Therefore, as the first and second transistors are both in non-active states, neither of the data bits IN1 and IN2 transferred by the input signal lines 110 and 112 are transferred to the output signal line 132.

Regarding the output signal line 134, the square part 172 where the first transistor is formed is ion-injected or diffused with n-type impurities at the channel region, as shown by this solid line square part 172. Further, the square part 182 at which the second transistor is formed is not ion-injected or diffused with n-type impurities at the channel region, as shown by the dotted line square part 182, i.e. the first transistor formed at the square part 172 is a depletion type transistor and the second transistor formed at the square part 182 is an enhancement type transistor. As the first transistor is therefore in an active state and the second transistor is in a non-active state, the data bit IN1 transferred by the input signal line 110 is transferred to the output signal line 134 via the first transistor but the data bit IN2 transferred by the input signal line 112 is not transferred to the output signal line 134.

Figure 6:
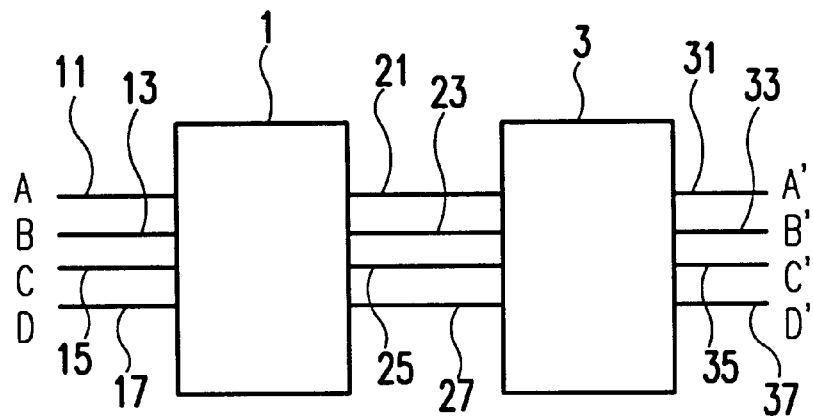
FIG. 6 is a structural view showing coding of data of a semiconductor device for illustrating a related technology.

It therefore follows that the data bit IN1 transferred by the input signal line 110 is transferred at the output signal line 134 and transferred to the circuit of the following stage as OUT 3, with data bit IN2 transferred by the input signal line 112 being transferred at the output signal line 130 and transferred to the circuit of the following stage as OUT 1. A further bit of data not shown in the drawings is transferred to the output signal line 132. When, for example, the data bits are "ABCD" with IN1="A" and IN2="B", it can be understood that the order is changed to "BXAY" (where X and Y are "C" or "D") when transferring to the circuit of the following stage. If the data converter 3 of FIG. 6 is prepared as the following circuit, an encryption process can be carried out for data for which this order is changed. Therefore, even if the conversion contents of the data converters 1 and 3 are known or can be analyzed, the secret number cannot be deciphered from the coded data simply based on the conversion contents because the order of the data bits comprising the data to be changed is modified during conversion. Further, as the first embodiment differs only in whether or not impurities are diffused at the channel regions of the first and second transistors formed every output signal line, which output signal line bits of data inputted from the input signal line are transferred to cannot be discerned even by looking at the wiring layout. Moreover, as two transistors are configured every signal line without causing the wiring configuration to become complicated and implantation or diffusion of impurities to the channel regions of the first and second transistors is carried out selectively, neither the manufacturing process nor the wiring configuration become complicated.

Figure 3:
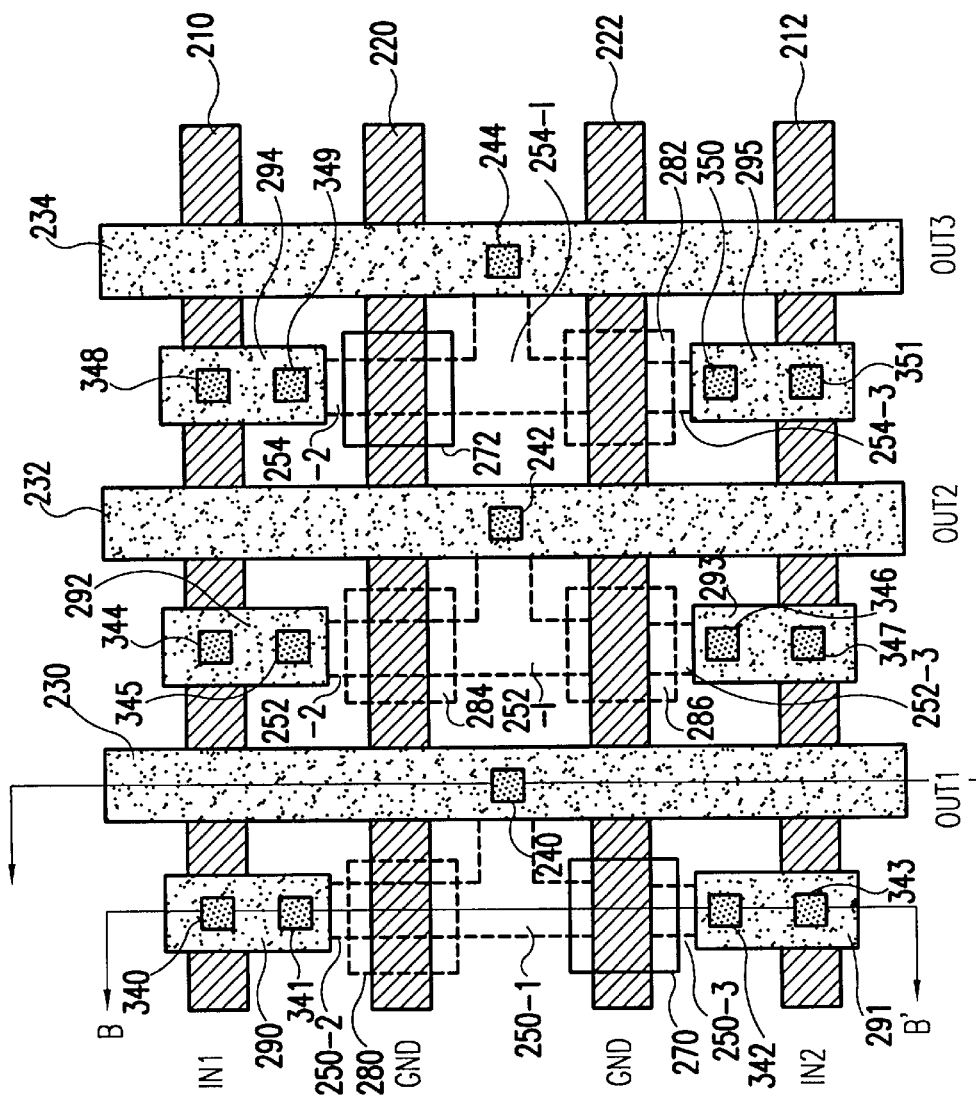
FIG. 3 is a view of the wiring layout of a semiconductor device of a second embodiment of the present invention.

Next, a detailed description is given using FIG. 3 of a second embodiment. FIG. 3 is a wiring layout diagram of a semiconductor device of a second embodiment of the present invention. As for FIG. 1, the wiring layout portion shown in FIG. 3 is used as the data line portion between the data converter 1 of FIG. 6 and the data converter 3. In the same way as FIG. 1, FIG. 3 shows a typical configuration for a two bit portion of data bits.

In FIG. 3, diffusion layers 250, 252 and 254 are formed, with input signal lines 210 and 212 each transferring one bit of data, respectively. The input signal lines 210 and 212 each extend parallel to each other in a first direction. Potential supply lines 220 and 222 for transferring signals having a prescribed potential are arranged between these input signal lines 210 and 212. In this embodiment a signal at earth potential is transferred to the potential supply lines 220 and 222 as the prescribed potential. Output signal lines 230, 232 and 234 are arranged on this wiring. These output signal lines extend parallel to each other in a second direction orthogonal to the first direction. Further, 290 to 295 are shown as auxiliary wiring. Contact portions 340 to 351 and transistor configuration portions 270, 272, 280, 282, 284 and 286 are also shown and will be described in detail later.

Figure 4:
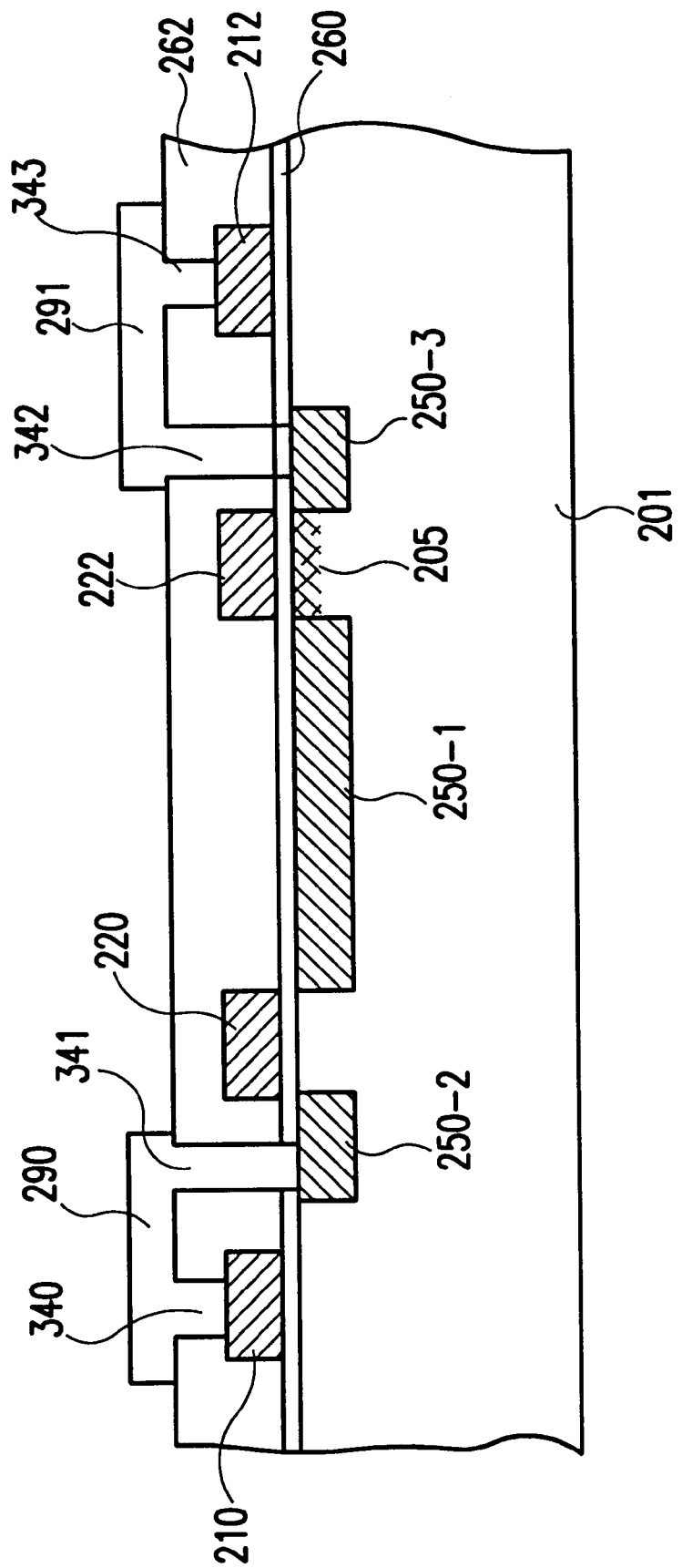
FIG. 4 is a cross-section taken along line B-B' of FIG. 3.
Figure 5:
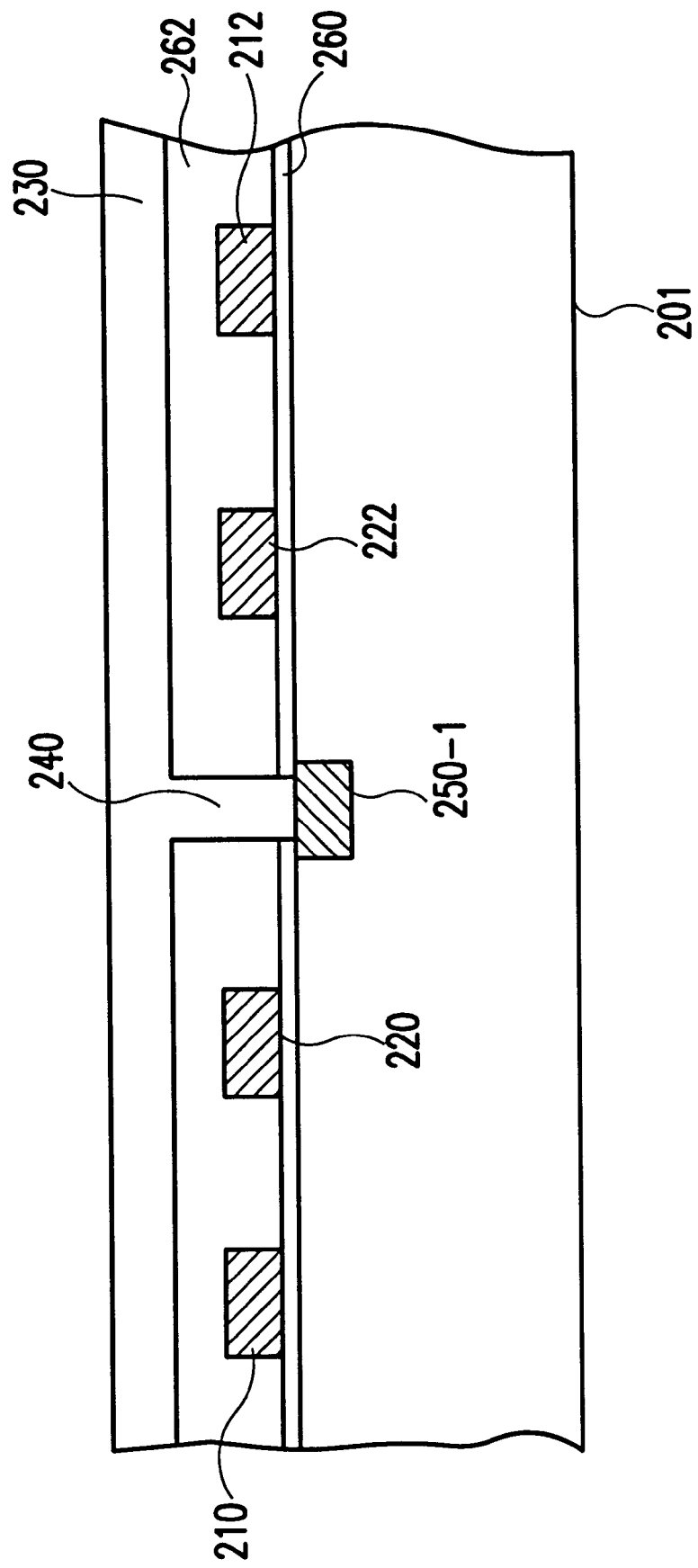
FIG. 5 is a cross-section taken along C-C' of FIG. 3.

A cross-sectional view taken along B-B' of FIG. 3 is shown in FIG. 4 and a cross-sectional view taken along C-C' of FIG. 4 is shown in FIG. 5 in order to illustrate the relationship of the connections of the above wiring. FIG. 4 and FIG. 5 only show the relationship between the input signal lines 210 and 212, the potential supply lines 220 and 222, and the output signal line 230. However, this cross-section is also the same for other output signal lines 232 and 234 and a description is therefore only given for parts that differ, not for parts of the same cross-section. Elements of the structures in FIG. 4 and FIG. 5 that are the same as for FIG. 3 are given the same numerals. In FIG. 4. diffusion layers 250-1, 250-2 and 250-3 are n+ diffusion layers formed within a p type substrate 201. A gate oxidation film 260 is then formed on the substrate 201. The potential supply line 220 is arranged on the gate oxidation film 260 between the diffusion layer 250-1 and the diffusion layer 150-2, i.e. a first transistor is constructed with the potential supply line 220 as a gate electrode and the diffusion layers 250-1 and 250-2 as two electrodes. This first transistor is formed at the square part 280 shown by the solid line in FIG. 3. Further, the potential supply line 222 is arranged on the gate oxidation film 260 between diffusion layer 250-2 and diffusion layer 250-3. Namely, a second transistor is constructed with the potential supply line 222 as a gate electrode and diffusion layer 250-2 and diffusion layer 250-3 as two electrodes. This second transistor is formed at the square part 270 shown by the dotted line in FIG. 1. Further, the input signal lines 210 and 212 are formed on the gate oxidation film 260 in such a manner as to sandwich the first and second transistors. Input signal lines 210 and 212, and potential supply lines 220 and 222 are wiring comprising polysilicon. The input signal line 210 and the potential supply line 220 are electrically connected via auxiliary wiring 290 formed on an insulation film 262 and the contact part 340. Further, input signal line 212 and potential supply line 222 are electrically connected via auxiliary wiring 292 formed on the insulation film 262 and contact parts 342 and 343. This auxiliary wiring comprises metal.

Next, in FIG. 5, the diffusion layer 250-1 is formed within the substrate 201. That the diffusion layer 250-1 of FIG. 5 is a part of the diffusion layer 250-1 of FIG. 4 can be confirmed from FIG. 3. The potential supply lines 220 and 222 are formed on the substrate 201 via the gate oxidation film 260 at a position that is sandwiched between the input signal lines 210 and 212. The diffusion layer 250-1 is electrically connected to the output signal line 230 formed on the insulation film 262 via a contact part 240. The output signal line 230 is of the same layer as auxiliary wiring 290 and 291, further auxiliary wiring 292 to 295 not shown in the drawings and further output signal lines 232 and 234, with these output signal lines being wiring comprising metal.

An impurity region 205 ion-implanted or diffused with an n-type impurity is formed between diffusion region 250-2 and diffusion region 250-3, i.e. at the channel region of the second transistor. The second transistor therefore becomes a depression-type transistor and the first transistor that does not have a channel region ion-implanted or diffused with an n-type impurity is formed as an enhancement type transistor. In FIG. 3, as with the first transistor, the portions at which enhancement type transistors are formed by not ion-implanting or diffusing a channel region with an n-type impurity are shown by a dotted line square parts. Further, as with the second transistor, the portions at which depletion type transistors are formed by ion implanting or diffusing a channel region with an n-type impurity are shown by solid line square parts.

In the above configuration earth potentials are supplied to the gate electrodes of the first and second transistors. The first transistor is therefore in a non-active state and the second transistor is in an active state. The data bit IN1 transferred by the input signal line 210 is therefore not transferred to the output signal line 230. However, the data bit IN2 transferred by the input signal line 212 is transferred to the output signal line 230 via the second transistor.

Next, a description is given of the other output signal lines 232 and 234 using FIG. 3. With regards to the output signal line 232, n-type impurities are not ion injected or diffused at the channel regions of the first and second transistors shown by the dotted line square parts 284 and 286, i.e. the first and second transistors formed at the square parts 284 and 286 are both enhancement type transistors. Therefore, as the first and second transistors are both in non-active states, neither of the data bits INI and IN2 transferred by the input signal lines 210 and 212 are transferred to the output signal line 232.

Regarding the output signal line 234, the square portion 272 where the first transistor is formed is ion-injected or diffused with n-type impurities at the channel region, as shown by the solid line square part. Further, the square part 282 at which the second transistor is formed is not ion-injected or diffused with n-type impurities at the channel region, as shown by the dotted line square part, i.e. the first transistor formed at the square part 272 is a depletion type transistor and the second transistor formed at the square part 282 is an enhancement type transistor. As the first transistor is therefore in an active state and the second transistor is in a non-active state, the data bit IN1 transferred by the input signal line 210 is transferred to the output signal line 234 via the first transistor but the data bit IN2 transferred by the input signal line 112 is not transferred to the output signal line 134.

It therefore follows that the data bit IN1 transferred by the input signal line 210 is transferred at the output signal line 234 and transferred to the circuit of the following stage as OUT 3, with data bit IN2 transferred by the input signal line 212 being transferred at the output signal line 230 and transferred to the circuit of the following stage as OUT 1. A further bit of data not shown in the drawings is transferred to the output signal line 232. The same operation can then be achieved for the second embodiment shown in FIG. 3 as for the first embodiment shown in FIG. 1 and the same results can be obtained.

The second embodiment is therefore more effective than the first embodiment in cases where the number of wires increases to an extent where the resistance due to this increase cannot be ignored because the input signal lines can be made of polysilicon wiring rather than of diffusion layers and delays in signal transmission can therefore be alleviated.

In the semiconductor device to which the present invention is applied, coded data can be decoded as follows. For example, a semiconductor device can be used for decoding. The wiring to be prepared in the semiconductor device and being for use in transferring data between two inverse data converters for carrying out conversions that are the inverse of the conversion method at the two data converters may be configured according to the present invention. FIG. 1 of the present invention, when the data bits are, for example, "ABCD" taking IN1="A" and IN2="B", in the case of a transfer to a circuit of the next stage, the order is changed to "BXAY" (where X and Y are "C" or "D") and changed to "B'X'A'Y'" as coded bits of data. At the semiconductor device for decoding, after inputted bits of data "B'X'A'Y'" undergo inverse conversion at inverse data converters for the data converter 2 of FIG. 1 so as to become bits of data "BXAY", if the configuration of FIG. 1 of the present invention is used, then IN1="B" and IN2="A". These can then be inputted as the bits of data "AXBY" at the inverse data converter for the data converter 1 of FIG. 1 in the following stage and it becomes clear that decoding can be achieved. With this decoding, as for the semiconductor device for decoding use, in addition to adopting the configuration of the present invention, changing of the order of the bits of data by the configuration of the present invention can be understood by designers of semiconductor devices for coding use. A table of information for returning to the order of the data bits can then be held and the transfer of data bits between inverse data converters can be managed by referring to this table.

Although described in detail in the above, the present invention is by no means limited to the above configurations. For example, input and output lines can be reversed with regards to the relationship of the layout of the input signal lines and the output signal lines of the embodiments. Each of the wiring materials are also not limited with respect to that shown in the above embodiments and can be selected to be appropriate to provide the same results as for the above in the present invention. The polarity of the substrate, transistor configuration and potentials supplied to the gate electrodes of the transistors can also be reversed providing the operation remains the same.

Figure 7:
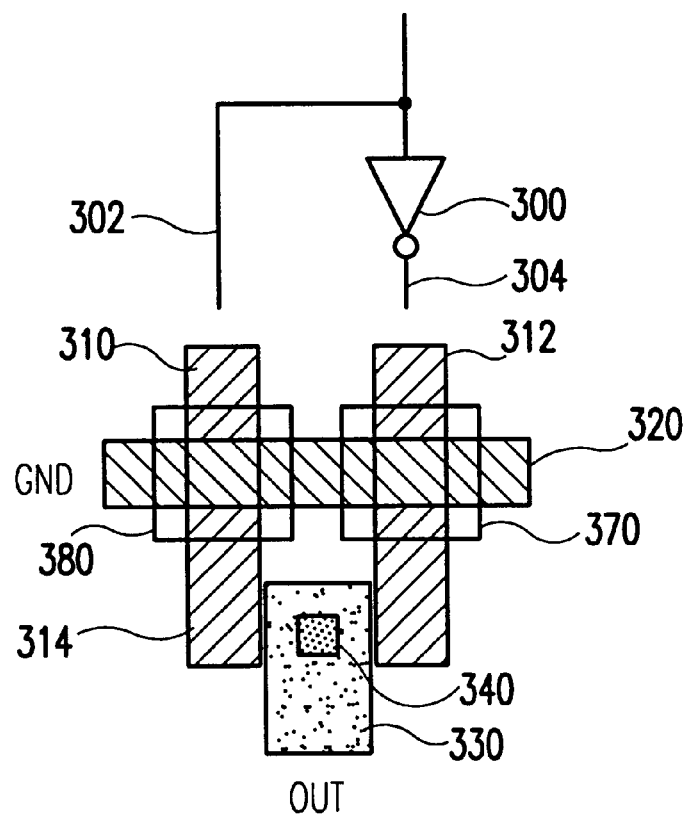
FIG. 7 is a view of the wiring layout for a semiconductor device of a third embodiment of the present invention.

The present invention is by no means limited to data line portions between data converters and can be applied as appropriate. FIG. 7 is an example applied to a data conversion processing portion for inverting and transferring bits of data for a certain data transfer line as a third embodiment.

In FIG. 7, input signal line 302 transfers inputted bits of data as is and input signal line 304 transfers a signal of bits of data inverted at inverter 300. Input signal line 310 is connected to input signal line 302 and the same bits of data that are transferred at the input signal line 302 are transferred. Input signal line 312 is connected to input signal line 304 and the same bits of data that are transferred at input signal line 304 are transferred. Input signal lines 310 and 320 are comprised of diffusion layers. If the substrate formed with these diffusion layers is a p-type semiconductor substrate as in FIG. 1, input signal lines 310 and 312 are n-type diffusion layers. A common signal line 314 is a diffusion layer formed as an inverted C-shape of the same type of conductor (an n-type in this example) as the input signal lines 310 and 312. Input signal line 302 and input signal line 310 can be the same, as can input signal line 304 and input signal line 312.

The potential supply line 320 extends across the input signal line 310 and the common signal line 314 and across the input signal line 312 and the common signal line 314. If the input signal lines 310 and 312 are taken to be n-type diffusion layers, a signal having an earth potential is transferred to the potential supply line 320. The potential supply line 320 is formed from, for example, polysilicon, and is arranged as a first layer on the semiconductor substrate via a gate oxidation film. A first transistor is constituted by the input signal line 310 and the common signal line 314 as first and second electrodes, respectively, and the potential supply line 320 as a gate electrode and is formed at a square part 380 shown by the dotted lines in FIG. 7 in the same way as for the square part 180 of FIG. 1. Further, a second transistor is constituted by the input signal line 312 and the common signal line 314 as first and second electrodes, respectively, and the potential supply line 320 as a gate electrode and is formed at a square part 370 shown by a solid line in FIG. 7 in the same way as for the square part 170 of FIG. 1. In the example of FIG. 7, an impurity region ion implanted or diffused with an n-type impurity is formed at the channel region of the second transistor and the second transistor is therefore a depletion type transistor. In the example in FIG.

7, an impurity region is not formed by implantation or diffusion of an n-type impurity at the channel region of the first transistor and the first transistor is therefore an enhancement type transistor.

An output signal line 330 is for transferring bits of data transferred by the input signal line 310 or the input signal line 312 via the first transistor or the second transistor. The output signal line 330 is electrically connected with the common signal line 314 by a contact portion 340. The output signal line 330 is formed of, for example, metal wiring and is arranged as a second layer up from the first layer on the semiconductor substrate via an inter-layer insulation film.

The first transistor is therefore an enhancement type and the second transistor is a depletion type, with the first transistor therefore being in a non-active state and the second transistor being in an active state. Bits of data transferred from the input signal line 310 are therefore not transferred to the output signal line 330. However, bits of data transferred from the input signal line 312 are transferred to the output signal line 330 via the second transistor. Therefore, if, for example, a data bit "1" is taken to be inputted as the input signal IN, a bit of data "0" inverted by the inverter 300 is transferred to the output signal line 330. Conversely, if an impurity region is formed at the channel region of the first transistor by implantation or diffusion of an n-type impurity and an impurity region is not formed in the channel region of the second transistor by impurity implantation or diffusion, the data bit "1" inputted as the input signal IN is transferred as is to the output signal line 330 via the first transistor.

It is therefore no longer possible to decipher data in a simple manner by determining whether or not a data conversion process for inverting transferred bits of data with respect to certain data transfer lines has been carried out and results that are substantially the same as the results obtained for the first embodiment can be obtained.

Figure 8:
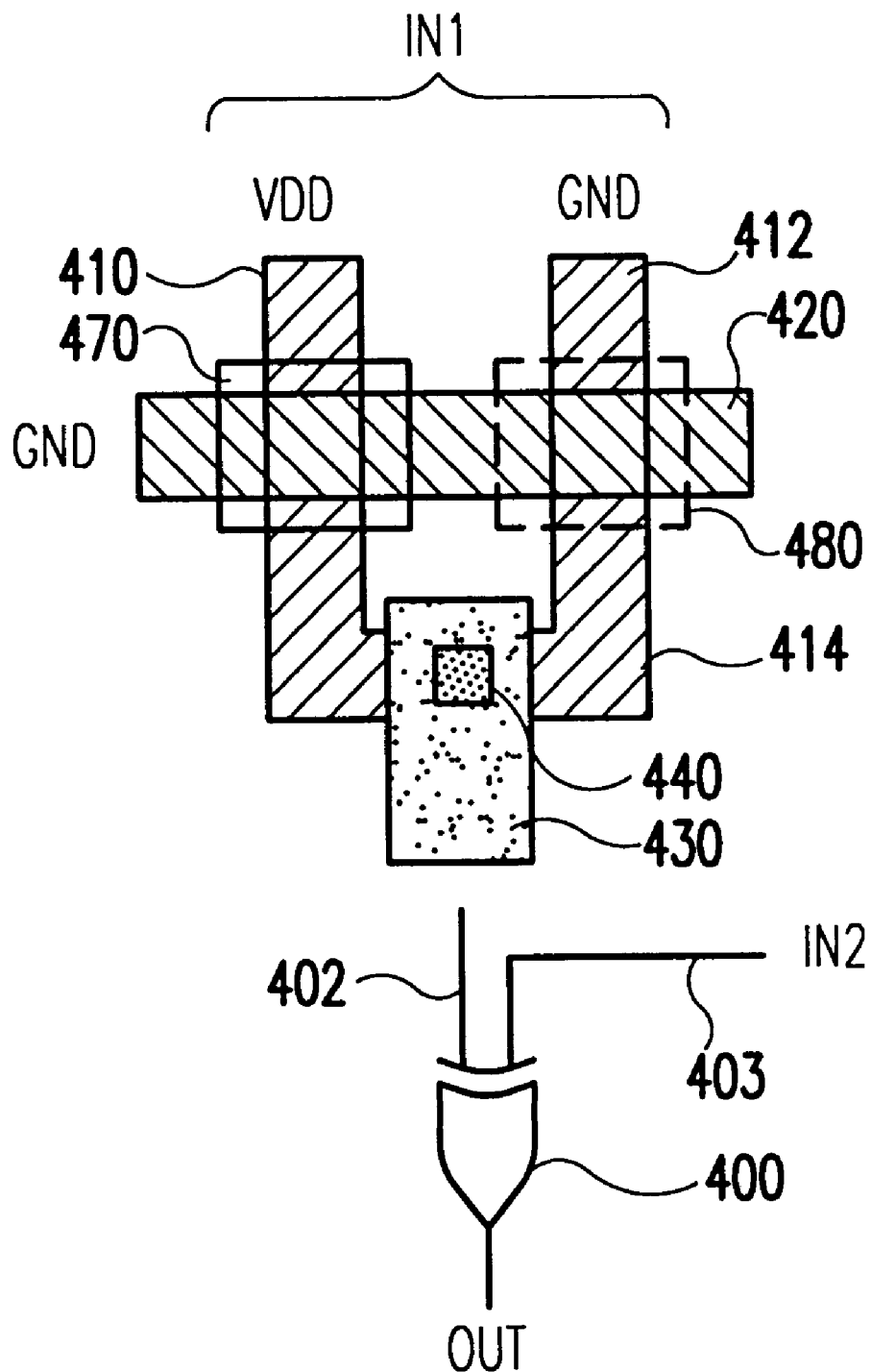
FIG. 8 is a view of the wiring layout of a semiconductor device of a fourth embodiment of the present invention.

FIG. 8 shows a modified example of FIG. 7 taken as a fourth embodiment, with input signal lines 410 and 412 of FIG. 8 corresponding to input signal lines 310 and 312 of FIG. 7 and a common signal line 414 of FIG. 8 corresponding to input signal line 314 of FIG. 7. A potential supply line 420 of FIG. 8 corresponds to the potential supply line 320 of FIG. 7, an output signal line 430 of FIG. 8 corresponds to an output signal line 330 of FIG. 7 and a contact portion 340 of FIG. 7 corresponds to a contact portion 440 of FIG. 8.

In FIG. 8, as in FIG. 7, as that constructed of a p-type semiconductor substrate is shown, the diffusion layer forming the input signal lines 410 and 412 and the common signal line 414 is n-type and a signal of an earth potential is transferred at the potential supply line.

In FIG. 8, a signal of a power supply potential is transferred at the input signal line 410 and a signal having an earth potential is transferred at the input signal line 412. The output signal line 430 is connected to one input of an exclusive OR circuit (hereinafter referred to as an X-OR circuit) 400 (shown as signal line 402 in FIG. 8. The output line 430 and the signal line 402 can be the same line). Further, an arbitrary input signal (for example, a data bit, etc.) IN2 is then inputted to the remaining input of the X-OR circuit 400 via the input line 404.

A first transistor is constituted by the input signal line 412 and the common signal line 414 as first and second electrodes and the potential supply line 420 as a gate electrode, and is formed at a square part 480 shown by the dotted lines in FIG. 8. Further, a second transistor is constituted by the input signal line 410 and the common signal line 414 as first and second electrodes and the potential supply line 420 as a gate electrode, and is formed at a square portion 470 shown by the solid line in FIG. 8. In the example in FIG. 8, an impurity region is formed at the channel region of the first transistor by implantation or diffusion of an n-type impurity so that the first transistor is a depletion-type transistor. An impurity region is not formed, however, at the channel region of the second transistor by implantation or diffusion of an n-type impurity and the second transistor is therefore an enhancement type. The first transistor is therefore in an active state and the second transistor is therefore in a non-active state so that a signal transferred from the input signal line 412 is not transferred to the output signal line 430. However, the signal transferred from the input signal line 410 is transferred to the output signal line 430 via the first transistor. Therefore, in FIG. 8, a signal of a power supply potential is inputted to one of the inputs of the X-OR circuit 400 as the input signal IN1 so that the output of the X-OR circuit 400 becomes a signal that is the inversion of the potential level of the input signal IN2. On the other hand, if an impurity region is not formed by implantation or diffusion of an n-type impurity at the channel region of the first transistor but an impurity region is formed by implantation or diffusion of an n-type impurity at the channel region of the second transistor, a signal of an earth potential is transferred to the output signal line 430 via the second transistor. In this case, a signal having an earth potential is inputted to one of the inputs of the X-OR circuit 400 as the input signal IN1 so that the output of the X-OR circuit 400 becomes a signal of the same potential level as the input signal IN2.

In FIG. 7, the present invention is applied to the output side and in FIG. 8 the present invention is applied to the input side with respect to the logic circuit. It therefore goes without saying that the same results are obtained for the configuration of FIG. 8 as for the configuration of FIG. 7. In FIG. 8, an example was give of an X-OR circuit in order to give an example of data conversion that is the same as that of FIG. 7 but the present invention is by no means limited in this respect.

The present invention is also by no means limited to data comprising a plurality of bits as described in FIG. 1 to FIG. 5 and can also be applied to single bits (or inverted signals) as shown in FIG. 7 and FIG. 8.

INDUSTRIAL APPLICABILITY

As is clear from the above, the present invention provides a semiconductor device capable of making deciphering of coded data more difficult and capable of improving security.

The present invention can be easily realized without the necessity of complicated manufacturing processes.

The present invention can further be realized without increasing the time taken to generate coded data.

The present invention can also bring about increased security for single bits (or signals to be transferred).

What is claimed is:

1. A semiconductor device comprising:
   a first transistor, having first and second electrodes and a gate electrode, with a first signal being received at said first electrode of said first transistor; and
   a second transistor, having first and second electrodes and a gate electrode, with a second signal being received at said first electrode of said second transistor;
   an output signal line electrically connected to said second electrode of said first transistor and said second electrode of said second transistor;

wherein, in said semiconductor device, a fixed voltage is supplied to said gate electrodes of said first and second transistors, and a channel region of said first transistor or said second transistor is selectively injected with an impurity to fix a state of said first transistor or said second transistor to a predetermined state, wherein said first signal or said second signal is selectively transferred to said output signal line.

2. A semiconductor device according to claim 1, wherein said semiconductor device further comprises a first data transfer line electrically connected to said first electrode of said first transistor for transferring said first signal, and a second data transfer line electrically connected to said first electrode of said second transistor for transferring said second signal.

3. A semiconductor device according to claim 1, wherein said second signal is inputted as a signal of a level inverted with respect to said first signal.

4. A semiconductor device according to claim 1, wherein said first signal is fixed at a first potential level, said second signal is fixed at a second potential level different from said first potential level, and said output signal line is an input of a logic circuit.

5. A semiconductor device according to claim 4, wherein said logic circuit is an exclusive OR circuit.

6. A semiconductor device according to claim 1, wherein said first electrode of said first transistor, said first electrode of said second transistor, and said common electrode are comprised of a diffusion layer.

7. A semiconductor device according to claim 1, wherein said semiconductor device is used with a security data.

8. A semiconductor device according to claim 1, wherein said first and second transistors are coupled with a data converter.

9. A semiconductor device according to claim 1, wherein said output signal line is positioned over said gate electrodes and extends in a first direction, and said gate electrodes extend in a direction orthogonal to said first direction.

10. A semiconductor device according to claim 1, wherein said second electrode of said first transistor is common with said second electrode of said second transistor.

11. A semiconductor device comprising:

a first transistor, having first and second electrodes and a gate electrode, with a first signal being received at said first electrode of said first transistor;

a second transistor, having first and second electrodes and a gate electrode, with a second signal being received at said first electrode of said second transistor; and an output signal line electrically connected to said second electrode of said first transistor and said second electrode of said second transistor;

wherein, in said semiconductor device, a fixed voltage is supplied to said gate electrodes of said first and second transistors, and a channel region of said first transistor or said second transistor is selectively injected with an impurity to control a conductive state of said first transistor or said second transistor, wherein said first signal or said second signal is selectively transferred to said output signal line, wherein said semiconductor device further comprises a first data transfer line electrically connected to said first electrode of said first transistor for transferring said first signal, and a second data transfer line electrically connected to said first electrode of said second transistor for transferring said second signal, and wherein said gate electrode of said first transistor extends in parallel with said first data transfer line and said gate electrode of said second transistor extends in parallel with said second data transfer line.

12. A semiconductor device according to claim 11, wherein said gate electrodes comprise polysilicon, and said first and second data transfer lines comprise polysilicon and are formed in a same layer as said gate electrodes.

13. A semiconductor device comprising:

a first transistor, having first and second electrodes and a gate electrode, with a signal being received at said first electrode of the first transistor;

a second transistor, having first and second electrodes and a gate electrode, with said signal being received at said first electrode of the second transistor;

a first output signal line electrically connected to said second electrode of said first transistor;

a second output signal line electrically connected to said second electrode of said second transistor;

wherein, in said semiconductor device, a fixed voltage is supplied to said gate electrodes of said first and second transistors, and a channel region of said first transistor or said second transistor is selectively injected with an impurity to fix a state of said first transistor or said second transistor to a predetermined state, wherein said signal is selectively transferred to said first output signal line or said second output signal line.

14. A semiconductor device according to claim 13, wherein said semiconductor device further comprises a data transfer line electrically connected to said first electrode of said first transistor and said first electrode of said second transistor for transferring said signal.

15. A semiconductor device according to claim 13, wherein said first and second electrodes of said first transistor, and said first and second electrodes of said second transistor are comprised of a diffusion layer.

16. A semiconductor device according to claim 13, wherein said semiconductor device is used with a security data.

17. A semiconductor device according to claim 13, wherein said first and second transistors are coupled with a data converter.

18. A semiconductor device according to claim 13, wherein said first and second output signal lines are positioned over said gate electrodes and extend in a first direction, and said gate electrodes extend in a direction orthogonal to said first direction.

19. A semiconductor device comprising:

a first transistor, having first and second electrodes and a gate electrode, with a signal being received at said first electrode of the first transistor;

a second transistor, having first and second electrodes and a gate electrode, with said signal being received at said first electrode of the second transistor;

a first output signal line electrically connected to said second electrode of said first transistor;

a second output signal line electrically connected to said second electrode of said second transistor;

wherein, in said semiconductor device, a fixed voltage is supplied to said gate electrodes of said first and second transistors, and a channel region of said first transistor or said second transistor is selectively injected with an impurity to control a conductive state of said first transistor or said second transistor, wherein said signal is selectively transferred to said first output signal line or said second output signal line;

wherein said semiconductor device further comprises a data transfer line electrically connected to said first electrode of said first transistor and said first electrode of said second transistor for transferring said signal, and wherein said gate electrodes of said transistors extend in parallel with said data transfer line.

20. A semiconductor device according to claim 19, wherein said gate electrodes comprise polysilicon, and said data transfer lines comprise polysilicon and are formed in a same layer as said gate electrodes.

* * * * *